United States Patent
Han

(10) Patent No.: US 8,836,402 B2
(45) Date of Patent: Sep. 16, 2014

(54) PHASE SPLITTER

(71) Applicant: SK hynix Inc., Icheon (JP)

(72) Inventor: Min Sik Han, Icheon (JP)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 13/846,005

(22) Filed: Mar. 18, 2013

(65) Prior Publication Data

US 2014/0176214 A1    Jun. 26, 2014

(30) Foreign Application Priority Data

Dec. 24, 2012 (KR) .................. 10-2012-0151753

(51) Int. Cl.
*H03K 3/00* (2006.01)
*H03H 11/16* (2006.01)
*H03K 5/13* (2014.01)
*H03K 5/15* (2006.01)

(52) U.S. Cl.
CPC ........................................ *H03K 5/15* (2013.01)
USPC ............. 327/256; 327/257; 327/258; 326/95; 326/96; 326/97

(58) Field of Classification Search
CPC ............ H03K 5/151; H03K 5/22; H03L 7/087
USPC .................. 327/256, 257, 258; 326/95, 96, 97
See application file for complete search history.

(56) References Cited

U.S. PATENT DOCUMENTS 6,836,163 B2 * 12/2004 Spehar .......................... 327/141
7,816,948 B1 * 10/2010 Sanchez .......................... 326/80

FOREIGN PATENT DOCUMENTS

KR    1020030003389 A    1/2003
KR     100668853 B1      1/2007

* cited by examiner

*Primary Examiner* — John Poos
(74) *Attorney, Agent, or Firm* — William Park & Associates Patent Ltd.

(57) ABSTRACT

A phase splitter includes: a first signal path; and a second signal path, wherein the phase splitter outputs an internal signal of the first signal path as a first phase signal, and mixes an output signal of the first signal path with an output signal of the second signal path, thereby outputting a second phase signal having a predetermined phase difference from the first phase signal.

15 Claims, 2 Drawing Sheets

PHASE SPLITTER

CROSS-REFERENCES TO RELATED APPLICATION

The present application claims priority under 35 U.S.C. §119(a) to Korean application number 10-2012-0151753, filed on Dec. 24, 2012, in the Korean Intellectual Property Office, which is incorporated herein by reference in its entirety.

BACKGROUND

1. Technical Field

Various embodiments generally relate to a semiconductor integrated circuit, and more particularly, to a phase splitter.

2. Related Art

A semiconductor integrated circuit apparatus may require signals having a predetermined phase difference, and include a phase splitter configured to split the phase of an input signal such that the split signals have the predetermined phase difference.

Referring to FIG. 1, the conventional phase splitter 1 may include delay circuits 11 to 13 composed of N(N is integer) inverters, delay circuits 14 and 15 composed of (N−1) inverters, and an RC delay circuit 16.

an input signal IN is passed through the delay circuits 11 to 13, a first phase signal OUT1 is generated.

Furthermore, as the input signal IN is passed through the delay circuits 14 and 15 and the RC delay circuit 16, an inverted signal of the first phase signal OUT1, that is, a second phase signal OUT2 having a phase difference of 180 degrees from the first phase signal OUT1 is generated.

The number of inverters forming the delay circuits 11 to 13 is different by 1 from the number of inverters forming the delay circuits 14 and 15 such that the signal generated by the delay circuits 11 to 13 has an inverted phase from the signal generated by the delay circuits 14 and 15.

Therefore, the RC delay circuit 16 is included to match a phase difference between the first and second phase signals OUT1 and OUT2.

However, while the inverter 11 for generating the first phase signal OUT1 has a fan-out of 1, the inverter 14 for generating the second phase signal OUT2 has a fan-out of 1 based on the inverter 15 and a fan-out of α based on the RC delay circuit, that is, a fan-out of (1+α).

Therefore, in the conventional phase splitter 1, the duty rates of the first and second phase signals OUT1 and OUT2 may be changed by the RC delay circuit 16, depending on a process, voltage, and temperature (PVT) variation.

SUMMARY

In one embodiment of the present invention, a phase splitter includes: a first signal path; and a second signal path, wherein the phase splitter outputs an internal signal of the first signal path as a first phase signal, and mixes an output signal of the first signal path with an output signal of the second signal path, thereby outputting a second phase signal having a predetermined phase difference from the first phase signal.

In an embodiment of the present invention, a phase splitter includes: a first signal path configured to include a plurality of signal nodes for generating a plurality of internal signals and output one of a plurality of internal signals as a first phase signal; a second signal path; and a fan-out controller configured to control fan-outs of the first and second signal paths such that the first second phase signal and a second phase signal are generated according to the same fan-out, wherein the phase splitter mixes the first phase signal with an output signal of the second signal path, and outputs the second phase signal having a predetermined phase difference from the first phase signal.

In an embodiment of the present invention, a phase splitter includes: a first signal path including an odd number (N) of inverters; a phase signal output inverter configured to receive an output signal of an intermediate inverter among the odd number of inverters, and generate a first phase signal; a second signal path including an odd number (N−2) of inverters; and a second phase signal output inverter configured to receive an output signal of the final inverter of the first signal path and an output signal of the final inverter of the second signal path and output a second phase signal having a predetermined phase difference from the first phase signal.

In an embodiment of the present invention, a phase splitter includes: a first signal path including an odd number (N) of inverters; a first phase signal output inverter configured to receive an output signal of an intermediate inverter among the odd number of inverters and generate a first phase signal; a first fan-out control inverter having input and output terminals coupled to input and output terminals of the intermediate inverter; a second signal path including an odd number (N−2) of inverters; a second fan-out control inverter having an input terminal coupled to an output terminal of the final inverter of the first signal path and an input terminal of the final inverter of the second signal path; and a second phase signal output inverter configured to receive an output signal of the final inverter of the first signal path and an output signal of the final inverter of the second signal path and output a second phase signal having a predetermined phase difference from the first phase signal.

BRIEF DESCRIPTION OF THE DRAWINGS

Features, aspects, and embodiments are described in conjunction with the attached drawings, in which.

DETAILED DESCRIPTION

Hereinafter, a phase splitter according to the present invention will be described below with reference to the accompanying drawings through exemplary embodiments.

Figure 1:
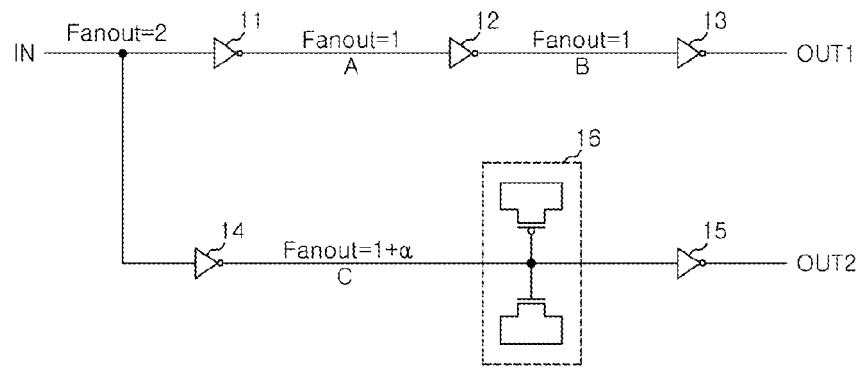
FIG. 1 is a circuit diagram of a conventional phase splitter 1.
Figure 2:
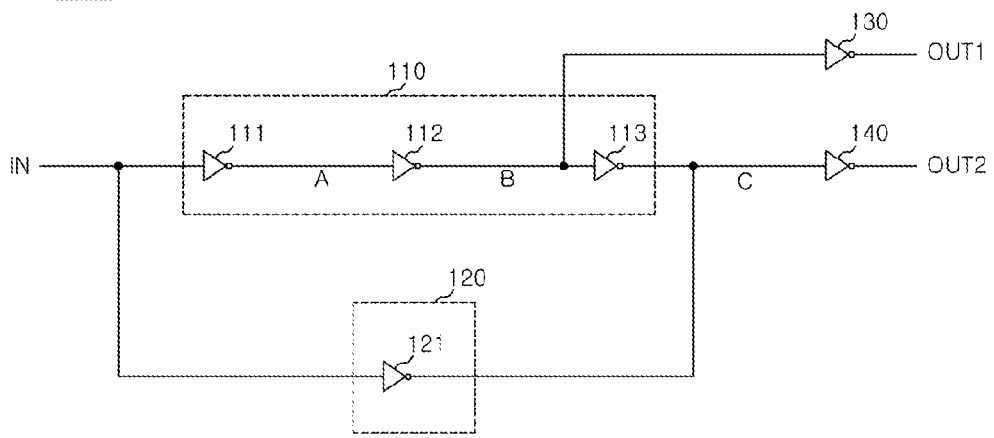
FIG. 2 is a circuit diagram of a phase splitter 100 according to one embodiment of the present invention.

Referring to FIG. 2, the phase splitter 100 may include a first signal path 110, a second signal path 120, a first phase signal output unit 130, and a second phase signal output unit 140.

The first signal path 110 may include N inverters 111 to 113. For example, N may be set to 3 (N=3). That is, the first signal path 110 may be configured to include a first inverter 111, a second inverter (or an intermediate inverter) 112 and a third inverter (or a final inverter) 113.

The first phase signal output unit 130 may be configured to receive an output signal at a node B (hereinafter, signal B) of the second inverter 112 among the inverters 111 to 113 and generate a first phase signal OUT1. The first phase signal output unit 130 may be an inverter.

The second signal path 120 may include N−2 inverters 121.

In this case, since N is 3, the second signal path 120 may include one inverter.

The second phase signal output unit 140 may be configured to receive a signal at a node C (hereinafter signal C) obtained by mixing an output signal of the third inverter 113 of the first signal path 110 with an output signal of the inverter 121 of the second signal path 120, and output a second phase signal OUT2 having a predetermined phase difference from the first phase signal OUT1, that is, a phase difference of 180 degrees. For example, the second phase signal output unit 140 may be an inverter.

The inverters 111 to 113, 121, 130, and 140 of the phase splitter 100 may be designed to have the same size. Thus, the inverters may have the same driving ability.

The phase splitting operation of the phase splitter 100 according to the embodiment of the present invention will be described as follows.

An input signal IN is inputted to the first signal path 110. That is, the input signal IN is inputted to the first inverter 111. An output signal of the first inverter 111 (a signal at the node A) is inputted to the second inverter 112. The signal B, that is, an output signal of the second inverter 112 is inputted to the first phase signal unit 130, and the first phase signal unit 130 generates the first phase signal OUT1.

Furthermore, the signal C obtained by mixing an output signal of the first signal path 110 and an output signal of the second signal path 120 is outputted as the second phase signal OUT2 through the second phase signal output inverter 140.

An effective delay time (amount) of the signal C may be a delay time (amount) corresponding to an intermediate value between a delay time (amount) of the first signal path 110 (that is, a total delay time of the inverters 111 to 113) and a delay time (amount) of the second signal path 120 (that is, a delay time of the inverter 121). Substantially, the effective delay time (amount) of the signal C may correspond to a delay time passed through the two inverters 111 and 112.

Therefore, the first and second phase signals OUT1 and OUT2 may have a predetermined phase difference of 180 degrees, and simultaneously have the same delay time.

Figure 3:
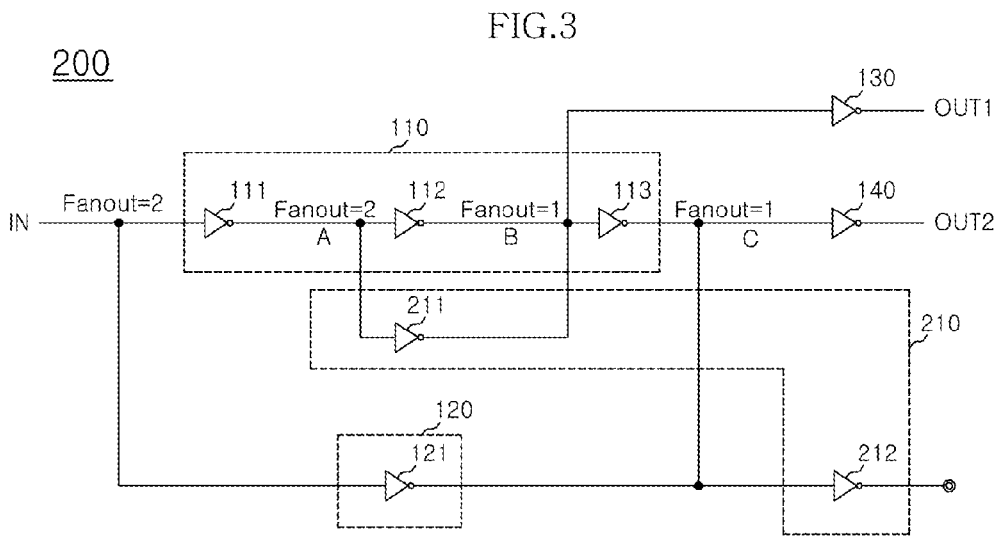
FIG. 3 is a circuit diagram of a phase splitter 200 according to another embodiment of the present invention.

Referring to FIG. 3, the phase splitter 200 may include a first signal path 110, a second signal path 120, a first phase signal output unit 130, a second phase signal output unit 140, and a fan-out controller 210.

The first signal path 110 may include N inverters 111 to 113. For example, N may be set to 3 (N=3). That is, the first signal path 110 may be configured to include a first inverter 111, a second inverter 112 and a third inverter 113. The first phase signal output unit 130 may be configured to receive an output signal at a node B (hereinafter signal B) of the second inverter 112 among the inverters 111 to 113 and generate a first phase signal OUT1. For example the first phase signal outp unit 130 may be an inverter.

The second signal path 120 may include N−2 inverters 121. At this time, since N=3, the second signal path 120 may include one inverter 121.

The second phase signal output unit 140 may be configured to receive a signal at a node C obtained by mixing an output signal of the third inverter 113 of the first signal path 110 with an output signal of the inverter 121 of the second signal path 120, and output a second phase signal OUT2 having a predetermined phase difference from the first phase signal OUT1, that is, a phase difference of 180 degrees. For example, the second phase signal output unit 140 may be an inverter.

The fan-out controller 210 may be configured to control fan-outs of the first and second signal paths 110 and 120 such that the first and second phase signals OUT1 and OUT2 are generated by the same fan-out.

The fan-out controller 210 may include a first fan-out control inverter 211 and a second fan-out control inverter 212.

An input terminal of the first fan-out control inverter 211 may be coupled to the node A (an input terminal of the second inverter 112 of the first signal path 110) and an output terminal of the first fan-out control inverter 211 may be coupled to the node B (an output terminal of the second inverter 112 of the first signal path 110).

An input terminal of the second fan-out control inverter 212 may be coupled to the node C (an output terminal of the third inverter 113 of the first signal path 110). The node C may be coupled to an output terminal of the inverter 121 of the second signal path 120.

An output terminal of the second fan-out control inverter 212 may be floated.

The inverters 111 to 113, 121, 130, 140, 211, and 212 of the phase splitter 200 according to the embodiment of the present invention may be designed to have the same size, that is, the same driving ability.

The phase splitting operation of the phase splitter 200 according to the embodiment of the present invention will be described as follows.

An input signal IN is inputted to the first signal path 110. That is, the input signal IN is inputted to the first inverter 111. An output signal of the first inverter 111 (a signal at the node A) is inputted to the second inverter 112. The signal B, that is, an output signal of the second inverter 112 is inputted to the first phase signal unit 130, and the first phase signal unit 130 generates the first phase signal OUT1.

Furthermore, the signal C obtained by mixing an output signal of the first signal path 110 and an output signal of the second signal path 120 is outputted as the second phase signal OUT2 through the second phase signal output inverter 140.

An effective delay time (amount) of the signal C may be a delay time (amount) corresponding to an intermediate value between a delay time (amount) of the first signal path 110 (that is, a total delay time of the inverters 111 to 113) and a delay time (amount) of the second signal path 120 (that is, a delay time of the inverter 121). Substantially, the effective delay time (amount) of the signal C may correspond to a delay time passed through the two inverters 111 and 112.

The input and output terminals of the first fan-out control inverter 211 may be coupled to the input and output terminals of the second inverter 112 of the first signal path 110, thereby setting the fan-out of the second inverter 112 to '1'.

Furthermore, the input terminal of the second fan-out control inverter 212 may be coupled to the output terminal of the third inverter 113 of the first signal path 110 and the output terminal of the inverter 121 of the second signal path 120, thereby setting the fan-out of the third inverter 113 of the first signal path 110 to '1'.

Accordingly, the first and second phase signal output inverters 130 and 140 are driven by the same fan-out.

Therefore, the first and second phase signals OUT1 and OUT2 may have a predetermined phase difference of 180 degrees and the same delay time. Furthermore, since the first and second phase signals OUT1 and OUT2 are driven according to the same fan-out, the first and second phase signals OUT1 and OUT2 have a duty rate variation insensitive to a PVT variation.

Figure 4:
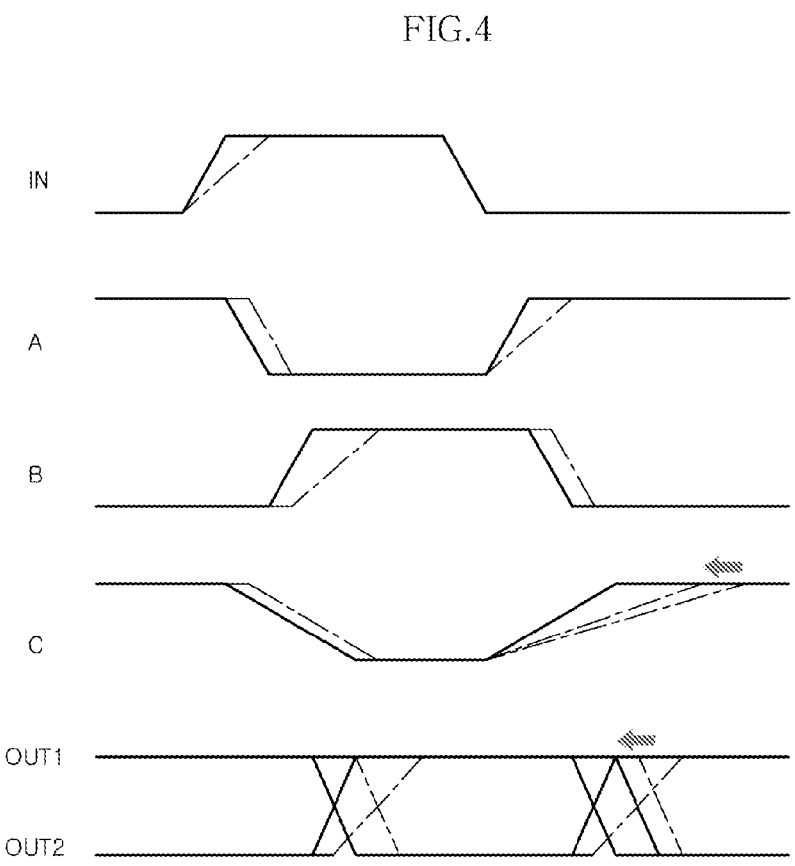
FIG. 4 is an output waveform diagram of the phase splitter according to the embodiment of the present invention.

Referring to FIG. 4, it can be seen that, although fluctuations of the input signal IN and the output signals A and B occur depending on a PVT variation, the duty rate variation of the first and second phase signals OUT1 and OUT2 is compensated for by the above-described fan-out control operation.

According to the embodiments of the present invention, it is possible to reduce a duty rate variation of an output signal depending on a PVT variation.

While certain embodiments have been described above, it will be understood to those skilled in the art that the embodiments described are by way of example only. Accordingly, the phase splitter described herein should not be limited based on the described embodiments. Rather, the phase splitter described herein should only be limited in light of the claims that follow when taken in conjunction with the above description and accompanying drawings.

What is claimed is:

1. A phase splitter comprising:
   a first signal path configured to generate an first output and a second output; and
   a second signal path configured to generate a third output,
   wherein the phase splitter is configured to output the first output as a first phase signal, and output a second phase signal by mixing the second output with the third output, thereby outputting the second phase signal having a predetermined phase difference from the first phase signal.

2. The phase splitter of claim 1, wherein the first signal path includes a plurality of signal nodes,
   wherein the first output is generated from a signal node before a final signal node among the signal nodes of the first signal path.

3. The phase splitter of claim 1, wherein the first signal path comprises N inverters.

4. The phase splitter of claim 3, wherein the second signal path comprises (N−2) inverters.

5. A phase splitter comprising:
   a first signal path configured to include a plurality of signal nodes for generating a plurality of internal signals and output one of a plurality of internal signals as a first phase signal;
   a second signal path; and
   a fan-out controller configured to control fan-outs of the first and second signal paths such that the first phase signal and a second phase signal are generated with same fan-out,
   wherein the phase splitter is configured to output the second phase signal having a predetermined phase difference from the first phase signal by mixing the first phase signal with an output signal of the second signal path.

6. The phase splitter of claim 5, wherein the one of the plurality of internal signals is generated from a signal node before the final signal node among the plurality of signal nodes.

7. The phase splitter of claim 5, wherein the first signal path comprises N inverters.

8. The phase splitter of claim 7, wherein the second signal path comprises (N−2) inverters.

9. The phase splitter of claim 5, wherein the fan-out controller comprises:
   a first inverter configured to mix an internal signal corresponding to a previous stage of the a first phase signal with the one of the plurality of internal signals; and
   a second inverter configured to receive a signal obtained by mixing the first phase signal and an output signal of the second signal path.

10. The phase splitter of claim 9, wherein an output of the second inverter is floated.

11. A phase splitter comprising:
    a first signal path comprising an odd number (N) of inverters;
    a first phase signal output unit configured to receive an output signal of an intermediate inverter among the odd number of inverters and generate a first phase signal;
    a first fan-out control unit having input and output terminals coupled to input and output terminals of the intermediate inverter;
    a second signal path comprising an odd number (N-2) of inverters;
    a second fan-out control unit having an input terminal coupled to an output terminal of the final inverter of the first signal path and an input terminal of the final inverter of the second signal path; and
    a second phase signal output unit configured to receive an output signal of the final inverter of the first signal path and an output signal of the final inverter of the second signal path and output a second phase signal having a predetermined phase difference from the first phase signal.

12. The phase splitter of claim 11, wherein an output of the second fan-out control unit is floated.

13. The phase splitter of claim 11, wherein the inverters included in the phase splitter have the same driving ability.

14. The phase splitter of claim 11, wherein the first phase signal output unit includes an inverter.

15. The phase splitter of claim 11, wherein the second phase signal output unit includes an inverter.

* * * * *